(12) United States Patent  
Sugimoto

(10) Patent No.: US 7,380,057 B2
(45) Date of Patent: *May 27, 2008

(54) STORAGE DEVICE CONTROLLING APPARATUS AND A CIRCUIT BOARD FOR THE SAME

(75) Inventor: Shuji Sugimoto, Kanagawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/580,250

(22) Filed: Oct. 11, 2006

(65) Prior Publication Data

US 2007/0079016 A1  Apr. 5, 2007

Related U.S. Application Data

(63) Continuation of application No. 10/693,180, filed on Oct. 24, 2003, now Pat. No. 7,136,962.

(30) Foreign Application Priority Data

Jan. 20, 2003 (JP) ............................. 2003-011591

(51) Int. Cl.
*G06F 13/00* (2006.01)
*G06F 1/16* (2006.01)

(52) U.S. Cl. .................... 711/112; 711/114; 710/1; 361/724; 361/748; 361/752; 361/807

(58) Field of Classification Search .................... None
See application file for complete search history.

(56) References Cited

U.S. PATENT DOCUMENTS 6,325,636 B1 * 12/2001 Hipp et al. .................. 439/61
6,510,050 B1    1/2003 Lee et al.
7,003,687 B2 *  2/2006 Matsunami et al. ........... 714/4
2001/0042167 A1  11/2001 Egawa (Continued)

FOREIGN PATENT DOCUMENTS

JP        2002-351703      12/2002

OTHER PUBLICATIONS

"IBM eServer pSeries 670 and pSeries 690 System Handbook" pp. 12-16, 36-50 (Oct. 2002).

*Primary Examiner*—Jasmnie Song
(74) *Attorney, Agent, or Firm*—Townsend and Townsend and Crew LLP

(57) ABSTRACT

A storage device controlling apparatus connected to a storage device storing data and connected to an information processing apparatus via a network, the apparatus being accommodated in a chassis, the apparatus comprising a circuit board accommodated in the chassis, the circuit board including: an I/O processor formed thereon, the I/O processor outputting to the storage device I/O requests corresponding to requests to input and output data from the information processing apparatus; an inner connector provided at an end to be located on an inner side of the chassis, at least the I/O processor and a power supply unit being connected through the inner connector; a file access processing section formed thereon, the file access processing section accepting the requests to input and output data on a file basis; and an electric power connector provided at an end to be located on an outer side of the chassis, electric power being supplied to the file access processing section through the electric power connector.

14 Claims, 10 Drawing Sheets

U.S. PATENT DOCUMENTS

2002/0152339 A1   10/2002   Yamamoto
2002/0178143 A1   11/2002   Fujimoto
2002/0196601 A1   12/2002   Lee et al.
2003/0204671 A1   10/2003   Matsunami et al.
2004/0057203 A1    3/2004   Rabinovitz

* cited by examiner

PHYSICAL DISK MANAGING TABLE 162a

| DISK NUMBER | CAPACITY | RAID | USAGE STATE |
|---|---|---|---|
| #001 | 100GB | 5 | USED |
| #002 | 100GB | 5 | USED |
| #003 | 100GB | 5 | USED |
| #004 | 100GB | 5 | USED |
| #005 | 100GB | 5 | USED |
| #006 | 50GB | — | UNUSED |
| ⋮ | ⋮ | ⋮ | ⋮ |

LU MANAGING TABLE 162b

| LU NUMBER | PHYSICAL DISK | CAPACITY | RAID |
|---|---|---|---|
| #1 | #001,#002,#003,#004,#005 | 100GB | 5 |
| #2 | #001,#002,#003,#004,#005 | 300GB | 5 |
| #3 | #006,#007, | 200GB | 1 |
| ⋮ | ⋮ | ⋮ | ⋮ |

FIG. 13

730 METADATA

| FILE NAME | TOP ADDRESS | CAPACITY | OWNER | UPDATE TIME |
|---|---|---|---|---|
| A | 7BSA | 200MB | X | 0:00 |
| B | 05BF | 50MB | X | 7:57 |
| C | 1F30 | 100MB | Y | 9:15 |
| D | 470B | 100MB | Z | 15:20 |
| ⋮ | ⋮ | ⋮ | ⋮ | ⋮ |

FIG. 14

721 FILE LOCK TABLE

| FILE NAME | LOCK/UNLOCK |
|---|---|
| A | LOCKED |
| B | — |
| C | — |
| D | LOCKED |
| ⋮ | ⋮ |

722 LU LOCK TABLE

| LU | LOCK/UNLOCK |
|---|---|
| SHARED | — |
| 1 | LOCKED |
| 2 | — |
| ⋮ | ⋮ |

STORAGE DEVICE CONTROLLING APPARATUS AND A CIRCUIT BOARD FOR THE SAME

CROSS-REFERENCE TO RELATED APPLICATIONS

The present application claims priority upon Japanese Patent Application No. 2003-011591 filed on Jan. 20, 2003, which is herein incorporated by reference.

BACKGROUND OF THE INVENTION

1. Field of the Invention

The present invention relates to a storage device controlling apparatus and a circuit board for the same.

2. Description of the Related Art

In recent years, the amount of data handled by computer systems has been greatly increased. For efficient use and management of such a huge amount of data, a technology has been developed, in which a plurality of disk array apparatuses (hereinafter referred to as a storage system) and information processing apparatuses are coupled through an exclusive network (Storage Area Network; hereinafter referred to as a SAN) to implement high-speed and massive access to the storage system. In order to couple the storage system and the information processing apparatuses through the SAN for high-speed data transfer, the network is usually constructed by use of communication equipment compliant with a Fibre-Channel protocol.

Meanwhile, a network system called a NAS (Network Attached Storage) has been developed, which couples a plurality of storage systems and information processing apparatuses through a network using TCP/IP (Transmission Control Protocol/Internet Protocol) to implement file level access to the storage systems. In the NAS, the file level access from the information processing apparatuses is allowed because the storage system is coupled to an apparatus having a file system function. Especially, a large-scale NAS is drawing attention these days, which includes a file system coupled to a storage system called a mid-range class or enterprise class, managed according to a RAID (Redundant Arrays of Inexpensive Disks) method which provides an enormous storage source (e.g., Japanese Patent Application Laid-Open Publication No. 2002-351703).

However, a conventional NAS has been achieved by coupling information processing apparatuses having TCP/IP communication and file system functions to a storage system without TCP/IP communication and file system functions. Therefore, an installation space has been required for the information processing apparatus to be coupled. Accordingly, a floor area occupied by the NAS has been increased due to such an installation space. Therefore there has been a possibility that a data storage capacity per the installation area of the NAS may be relatively reduced. Moreover, in the conventional NAS, the information processing apparatus and the storage system are coupled through the SAN in many cases due to the necessity for high-speed communication, and thus communication controlling equipment or communication control functions for the SAN has been required.

To increase the data storage capacity per the installation area of the NAS and reduce complication of the equipment and functions related to the SAN, it is assumed to add means of implementing the TCP/IP and the file system functions onto a circuit board having an interface function with the conventional information processing apparatus in the conventional NAS. In this case, this circuit board must be a circuit board which includes a new mode of being connected to the information processing apparatuses, the storage systems, and the like. Therefore, a chassis having accommodated the conventional circuit board must be replaced with a chassis which is suitable for the aforementioned new connection mode, thus increasing costs for the NAS. In addition, renewing both the circuit board and the chassis is a large burden on users.

SUMMARY OF THE INVENTION

The present invention has been made in view of the above described problems. An object of the present invention is to provide a storage device controlling apparatus and a circuit board for the storage device controlling apparatus.

A main aspect of the present invention is a storage device controlling apparatus coupled to a storage device storing data and coupled to an information processing apparatus via a network, the apparatus being accommodated in a chassis, the apparatus comprising a circuit board accommodated in the chassis, the circuit board including: an I/O processor formed thereon, the I/O processor outputting to the storage device I/O requests corresponding to requests to input and output data from the information processing apparatus; an inner connector provided at an end to be located on an inner side of the chassis, at least the I/O processor and a power supply unit being connected through the inner connector; a file access processing section formed thereon, the file access processing section accepting the requests to input and output data on a file basis; and an electric power connector provided at an end to be located on an outer side of the chassis, electric power being supplied to the file access processing section through the electric power connector.

Herein, the circuit board which is accommodated in the chassis and includes the I/O processor and the file access processing section formed thereon, the I/O processor outputting to the storage device I/O requests corresponding to requests to input and output data from the information processing apparatus, the file access processing section accepting the requests to input and output data on a file basis, is, for example, a circuit board of a later described channel controller in the NAS, namely, a NAS board. The file access processing section includes at least a network controller including a file system protocol such as a NFS (Network File System) or Samba. The NFS is a file system protocol for accepting file access requests from a UNIX (registered trademark)-based information processing apparatus. The Samba is a file system protocol for accepting file access requests from a Windows (registered trademark)-based information processing apparatus on which a CIFS (common Interface File System) is running. Note that the file access processing section may contain other software.

That the circuit board includes the electric power connector through which electric power is supplied to the file access processing section provided at the end to be located on the outer side of the chassis means that the connector through which electric power is supplied to the file access processing section formed on the circuit board of the channel controller is attached, for example, on the chassis's front side of the circuit board.

According to the aspect of the present invention, the function of the file processing section to accept the requests to input and output data on a file basis and the function of the I/O processor to output I/O requests, which have been conventionally provided in separate chassis, are implemented by a circuit board made as a unit, thus making the entire NAS compact.

Moreover, since the file access processing section is supplied with electric power through the electric power connector, which is different from the inner connector of the circuit board, the circuit board implementing the aforementioned two functions can be obtained without large modification of the conventional circuit board of the NAS. This is because part for supplying electric power of the existing connectors attached to the conventional circuit board of the NAS can be used in the NAS circuit board of the present invention with little modification. Accordingly, the conventional circuit board on which the file access processing section is newly formed can be used as a channel controller in the NAS according to the present invention. Similarly, without being largely modified, the existing chassis in the conventional NAS can be used with the circuit board of the channel controller of the NAS according to the present invention attached thereto.

Another main aspect of the present invention is a circuit board for a storage device controlling apparatus connected to a storage device storing data and connected to an information processing apparatus via a network, the apparatus and the circuit board being accommodated in a chassis, the circuit board comprising: an I/O processor formed thereon, the I/O processor outputting to the storage device I/O requests corresponding to requests to input and output data from the information processing apparatus; an inner connector provided at an end to be located on an inner side of the chassis, at least the I/O processor and a power supply unit being connected through the inner connector; a file access processing section formed thereon, the file access processing section accepting the requests to input and output data on a file basis; and an electric power connector provided at an end to be located on an outer side of the chassis, electric power being supplied to the file access processing section through the electric power connector.

The circuit board for the storage device controlling apparatus is, for example, a circuit board of the channel controller in the NAS, that is, a NAS board.

Features and objects of the present invention other than the above will become clear by reading the description of the present specification with reference to the accompanying drawings.

BRIEF DESCRIPTION OF THE DRAWINGS

For a more complete understanding of the present invention and the advantages thereof, reference is now made to the following description taken in conjunction with the accompanying drawings wherein:

FIG. 13 is a view showing metadata according to the present embodiment; and

FIG. 14 is a view showing lock tables according to the present embodiment.

DETAILED DESCRIPTION OF THE INVENTION

At least the following matters will be made clear by the explanation in the present specification and the description of the accompanying drawings.

===Overview of Storage System===

<<<Example of the Entire Construction>>>

An embodiment of the present invention will be described in detail with reference to the drawings.

Figure 1:
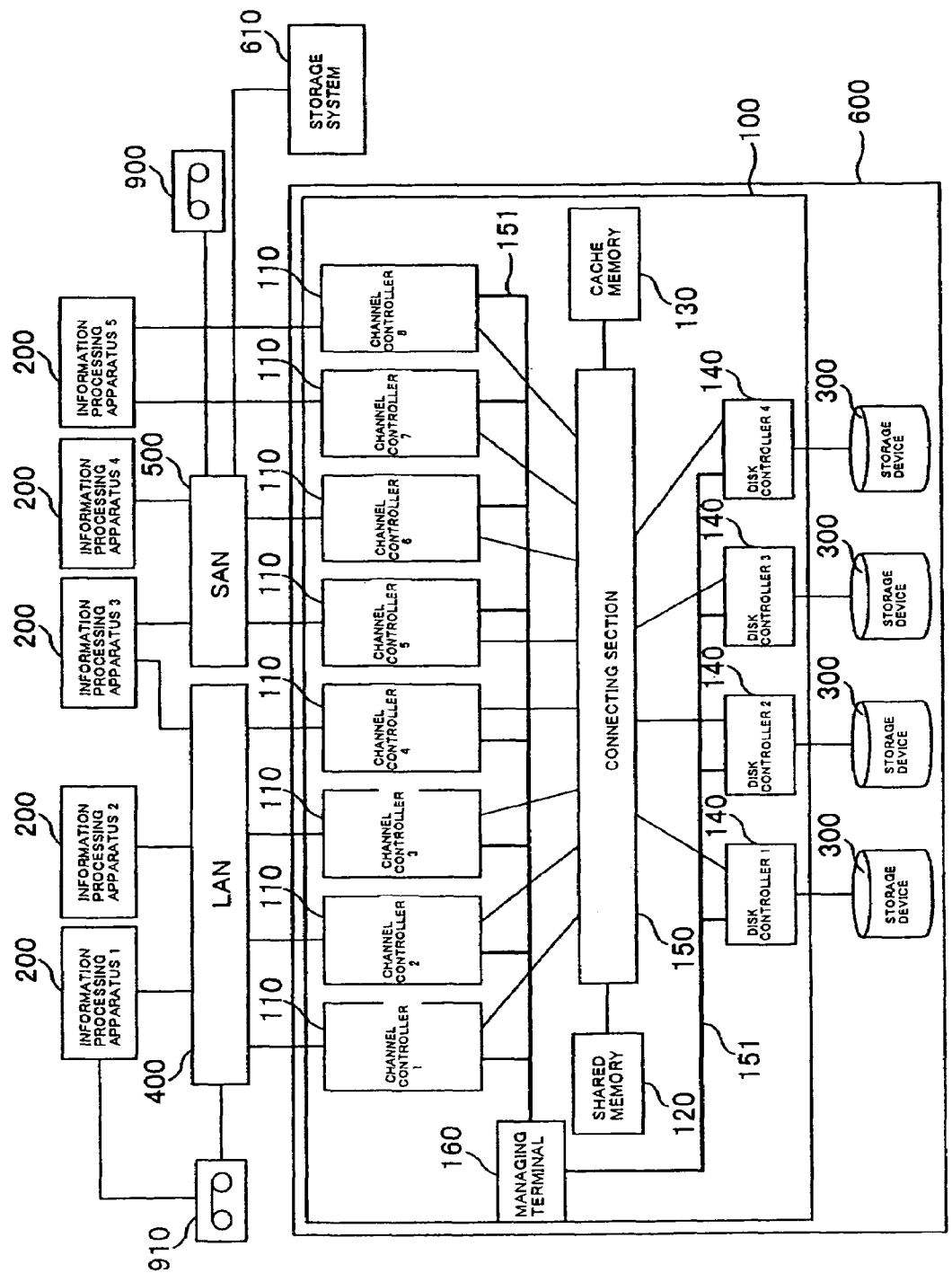
FIG. 1 is a block diagram showing the entire construction of a storage system according to the present embodiment.

FIG. 1 shows the entire construction of a storage system including a storage device controlling apparatus according to the present embodiment.

In the present embodiment, the storage system 600 comprises a storage device controlling apparatus 100 and storage devices 300. The storage device controlling apparatus 100 controls the storage devices 300 according to commands received from information processing apparatuses 200. For example, when requests to input and output data are received from a information processing apparatus 200, the storage device controlling apparatus 100 performs processing for the input and output of data stored in a storage device 300. Data is stored in a memory area, a logical volume (Logical Unit; hereinafter referred to as LU) logically set in a physical memory area provided by the disk drive of the storage device 300. The storage device controlling apparatus 100 also receives various commands from the information processing apparatuses 200 to manage the storage system 600.

The information processing apparatus 200 is a computer having a CPU (Central Processing Unit) and a memory. Execution of various programs by the CPU provided in the information processing apparatus 200 implements various functions. The information processing apparatus 200 may be, for example, a personal computer, a workstation or a mainframe computer.

In FIG. 1, the information processing apparatuses 1 to 3 (200) are connected to the storage device controlling apparatus 100 via a LAN (Local Area Network) 400. The LAN 400 may be the Internet or a dedicated network. Communication between the information processing apparatuses 1 to 3 (200) and the storage device controlling apparatus 100 is performed via the LAN 400 according to, for example, TCP/IP protocols. The information processing apparatuses 1 to 3 (200) send the storage system 600 data access requests with specified file names (requests to input and output data in terms of files; hereinafter referred to as file access requests).

The LAN 400 is connected to a backup device 910, which is specifically a disk-based device such as MO, CD-R or DVD-RAM, or a tape-based device such as a DAT tape, cassette tape, open tape or cartridge tape. The backup device 910 communicates with the storage device controlling apparatus 100 via the LAN 400 to store backup data for data stored in the storage device 300. Further, the backup device 910 can also be connected to the information processing apparatus 1 (200). In this case, backup data for data stored in the storage device 300 is acquired via the information processing apparatus 1 (200).

The storage device controlling apparatus 100 comprises channel controllers 1 to 4 (110). By the channel controllers 1 to 4 (110), the storage device controlling apparatus 100 communicates with the information processing apparatuses 1 to 3 (200) and the backup device 910 via the LAN 400. The channel controllers 1 to 4 (110) individually accept file access requests from the information processing apparatuses 1 to 3 (200). That is, the channel controllers 1 to 4 (110) are assigned respective network addresses on the LAN 400 (e.g., IP addresses), and each behaves as a NAS so that each NAS can provide service as NAS to the information processing apparatuses 1 to 3 (200) as if separate NASs were present. Hereinafter, the channel controllers 1 to 4 (110) are each referred to as CHN. Thus, one storage system 600 is constructed to have the CHNs 1 to 4 (110), which individually provide service as the NAS, and thereby NAS servers, which are operated individually on separate computers in the conventional art, are integrated into one storage system 600. Therefore, the entire storage system 600 can be managed so that various settings and controls, and maintenance such as fault management and version management are made more efficient.

Note that the CHNs 1 to 4 (110) of the storage device controlling apparatus 100 according to the present embodiment are implemented by hardware formed on an integrally unitized circuit board and software such as an operating system (hereinafter referred to as an OS) executed by this hardware and application programs running on this OS, as described later. Thus, the functions of the storage system 600 according to the present embodiment, which are implemented as part of hardware in the conventional art, are implemented by software. Hence, the storage controlling apparatus system 600 according to the present embodiment enables flexible system operation and can provide more finely tuned services to meet users, diverse and rapidly varying needs.

The information processing apparatuses 3, 4 (200) are connected to the storage device controlling apparatus 100 via a SAN (Storage Area Network) 500. The SAN 500 is a network for the storage device controlling apparatus 100 to exchange data with the information processing apparatuses 3, 4 (200) in blocks, units for managing data in the memory area provided by the storage device 300. The communication between the information processing apparatuses 3, 4 (200) and the storage device controlling apparatus 100 via the SAN 500 is performed usually according to a Fibre-Channel protocol. The information processing apparatuses 3, 4 (200) send requests to access data (hereinafter, referred to as block access requests) to the storage system 600 in blocks according to the Fibre-Channel protocol.

The SAN 500 is connected to a backup device 900 compatible with SAN, which communicates with the storage device controlling apparatus 100 via the SAN 500 to store backup data for data stored in the storage device 300.

The storage device controlling apparatus 100 comprises channel controllers 5, 6 (110). By the channel controllers 5, 6 (110), the storage device controlling apparatus 100 communicates with the information processing apparatuses 3, 4 (200) and the backup device 900 compatible with SAN via the SAN 500. Hereinafter, the channel controllers 5, 6 (110) are referred to as CHFs.

The information processing apparatus 5 (200) is connected to the storage device controlling apparatus 100 directly without a network such as the LAN 400 and the SAN 500. The information processing apparatus 5 (200) may be, for example, a mainframe computer. The communication between the information processing apparatus 5 (200) and the storage device controlling apparatus 100 is performed according to a communication protocol such as FICON (Fibre Connection) (registered trademark), ESCON (Enterprise System Connection) (registered trademark), ACONARC (Advanced Connection Architecture) (registered trademark), or FIBARC (Fibre Connection Architecture) (registered trademark). The information processing apparatus 5 (200) sends the storage system 600 block access requests according to the communication protocol.

The storage device controlling apparatus 100 communicates with the information processing apparatus 5 (200) by the channel controllers 7, 8 (110). Hereinafter, the channel controllers 7, 8 (110) are referred to as CHAs.

The SAN 500 is connected to another storage system 610 installed at a place (secondary site) remote from the place (primary site) where the storage system 600 is installed. The storage system 610 is used as a unit into which data is duplicated by a function of replication or remote copy. It is noted that the storage system 610 may also be connected to the storage system 600 via a communication line such as ATM, instead of the SAN 500. In this case, a channel controller 110 provided with an interface (channel extender) for using the abovementioned communication line is adopted.

According to the present embodiment, by installing CHNs 110, CHFs 110, and CHAs 110 together in the storage system 600, a storage system connected to different types of networks can be implemented. Specifically, the storage system 600 is a SAN-NAS integrated storage system, which is connected to the LAN 400 via CHNs 110 and to the SAN 500 via CHFs 110.

<<<Storage Device>>>

The storage device 300 in FIG. 1 comprises multiple disk drives (physical disks) and provides a memory area to the information processing apparatus 206. Data is stored in an LU, a memory area logically set on a physical memory area provided by the disk drive. Various units such as a hard disk unit, a flexible disk unit and a semiconductor memory unit can be used as the disk drive. Note that the storage device 300 can be, for example, a disk array formed of a plurality of disk drives. In this case, the memory area may be provided to the information processing apparatus 200 by the plurality of disk drives managed by a RAID.

The storage device controlling apparatus 100 and the storage devices 300 may be connected directly as shown in FIG. 1 or via a network. Alternatively, the storage devices 300 may be integrated with the storage device controlling apparatus 100.

The LUs set in the storage device 300 include user LUs accessible from the information processing apparatuses 200, a system LU used for controlling a channel controller 110, and the like. Stored in the system LU is an operating system executed in each channel controller 110. Each LU is made correspond to a channel controller 110, and thereby each channel controller 110 is assigned accessible LUs. In the correspondence, a plurality of channel controllers 110 can share one LU. Hereinafter, the user LU and the system LU are also referred to as a user disk and a system disk, respectively. An LU shared by a plurality of channel controllers 110 is referred to as a shared LU or a shared disk.

\<\<\<Storage Device Controlling Apparatus\>\>\>

As shown in FIG. 1, the storage device controlling apparatus 100 comprises the channel controllers 110, a shared memory 120, a cache memory 130, disk controllers 140, a managing terminal 160, and a connecting section 150.

The channel controller 110 comprises a communication interface to communicate with the information processing apparatuses 200 and a function to receive data input and output commands, etc., with the information processing device 200. For example, the CHNs 110 accept file access requests from the information processing apparatuses 1 to 3 (200) and obtain the memory addresses and data lengths of the files to output I/O requests corresponding to the file access requests so as to access storage devices 300. Accordingly, the storage system 600 can provide service as a NAS to the information processing apparatuses 1 to 3 (200). Note that the I/O request includes the top address, data length, and type of access such as read or write, of data. When data is to be written, the I/O request may include data to be written. I/O requests are outputted by an I/O processor 119 described later. The CHFs 110 accept block access requests from the information processing apparatuses 3, 4 (200) according to the Fibre-Channel protocol. Thus, the storage system 600 can provide high-speed accessible data storage service to the information processing apparatuses 3, 4 (200). The CHAS 110 accept block access requests from the information processing apparatus 5 (200) according to a protocol such as FICON, ESCON, ACONARC, or FIBARC. Accordingly, the storage system 600 can provide data storage service to the information processing apparatus 5, a mainframe computer.

The channel controllers 110 and the managing terminal 160 are connected by an internal LAN 151. Accordingly, micro-programs, etc., executed by the channel controllers 110 can be sent from the managing terminal 160 and installed therein. The construction of the channel controllers 110 is described later.

In FIG. 1, the connecting section 150 connects the channel controllers 110, the shared memory 120, the cache memory 130, and the disk controllers 140. Data and commands are sent and received to and from the channel controllers 110, the shared memory 120, the cache memory 130, and the disk controllers 140 via the connecting section 150. The connecting section 150 is constituted by, for example, a high-speed bus such as a cross bus switch which transmits data by high-speed switching. Since the channel controllers 110 are connected with each other by the high-speed bus, the communication performance between the channel controllers 110 is greatly improved over the conventional construction where the NAS servers operating on individual computers are connected via a LAN. This enables a high-speed file sharing function, high-speed fail-over, and the like.

The shared memory 120 and the cache memory 130 are memories shared by the channel controllers 110 and the disk controllers 140. The shared memory 120 is mainly used to store control information, commands, etc., while the cache memory 130 is mainly used to store data.

For example, when a data input/output command received by a channel controller 110 from an information processing apparatus 200 is a write command, the channel controller 110 writes the write command into the shared memory 120 and data received from the information processing apparatus 200 into the cache memory 130. Meanwhile, the disk controllers 140 are monitoring the shared memory 120. When the disk controllers 140 detect that the write command has been written into the shared memory 120, one of the disk controllers 140 reads the data from the cache memory 130 and writes the data into a relevant storage device 300 according to the command.

When a data input/output command received by a channel controller 110 from an information processing apparatus 200 is a read command, the channel controller 110 writes the read command into the shared memory 120 and checks whether to-be-read data is present in the cache memory 130. If the data is present in the cache memory 130, the channel controller 110 sends the data to the information processing apparatus 200. On the other hand, if the to-be-read data is not present in the cache memory 130, a disk controller 140 monitoring the shared memory 120 detects that the read command has been written into the shared memory 120 and reads the to-be-read data from a relevant storage device 300 to write the data into the cache memory 130 and a notice thereof in the shared memory 120. Thereafter, when the channel controller 110 detects that the to-be-read data has been written into the cache memory 130 by monitoring the shared memory 120, the channel controller 110 sends the data to the information processing apparatus 200.

Note that other than the construction where instructions to write and read data are indirectly sent from the channel controller 110 to the disk controller 140 via the shared memory 120, for example, the storage device controlling apparatus 100 may have construction where instructions to write and read data are sent directly from a channel controller 110 to a disk controller 140 without the shared memory 120.

A disk controller 140 controls a storage device 300. For example, as described above, according to a data write command received from an information processing apparatus 200, a channel controller 110 writes the data into the storage device 300. Further, a request sent from the channel controller 110 to access data in an LU designated by a logical address is converted into a request to access data in a physical disk designated by a physical address. If the physical disks in the storage device 300 are managed by RAID, data is accessed according to the structure of the RAID. Moreover, the disk controller 140 controls management of the duplication and backup of data stored in the storage device 300. Furthermore, the disk controller 140 controls to store duplication of data in the storage system 600 at the primary site into another storage system 610 installed in the secondary site (a replication or remote copy function) for the purpose of preventing data loss in the occurrence of disaster (disaster recovery).

The disk controllers 140 and the managing terminal 160 are connected to each other via the internal LAN 151 and can communicate with each other. This enables micro-programs, etc., executed by the disk controllers 140 to be sent from the managing terminal 160 and installed therein. The construction of the disk controllers 140 is described later.

In the present embodiment, the shared memory 120 and the cache memory 130 are provided separately from the channel controllers 110 and the disk controllers 140. The present embodiment is not limited to this case. It is also preferable that the shared memory 120 or the cache memory 130 is dispersed to be provided in each of the channel controllers 110 and the disk controllers 140. In this case, the connecting section 150 connects the channel controllers 110 and disk controllers 140, which have dispersed shared memories or cache memories.

\<\<\<Managing terminal\>\>\>

The managing terminal 160 in FIG. 1 is a computer for maintaining and managing the storage system 600. By operating the managing terminal 160, it is possible to set the structure of the physical disks and LUs in the storage device 300 and install micro-programs executed by the channel controllers 110. Herein, in the setting of the structure of the physical disks in the storage device 300, for example, physical disks can be added or removed, and the RAID structure can be changed (e.g., a change from RAID1 to RAID5). Further, via the managing terminal 160, it is possible to perform various operations, including: confirming the operation state of the storage system 600; identifying a fault section; and installing operating systems executed by the channel controllers 110. Yet further, the managing terminal 160 is connected to an external maintenance center via a LAN, a telephone line, etc., so that it is possible to monitor faults in the storage system 600 and quickly deals with faults when occurred by use of the managing terminal 160. The occurrence of faults is notified by, for example, OSs, application programs, driver software, etc. The faults are notified through a HTTP protocol, a SNMP (Simple Network Management Protocol), e-mails and the like. These are set and controlled by an operator and the like via a Web page serving as a user interface provided by a Web server operating on the managing terminal 160. The operator and the like can also designate objects subjected to fault monitoring and set its contents and targets to be notified of faults.

The managing terminal 160 can be incorporated into the storage device controlling apparatus 100 or attached thereto externally. Further, the managing terminal 160 may be a computer which exclusively maintains and manages the storage device controlling apparatus 100 and the storage devices 300 or a general-purpose computer having a maintenance and management function.

Figures 2, 3, 4:
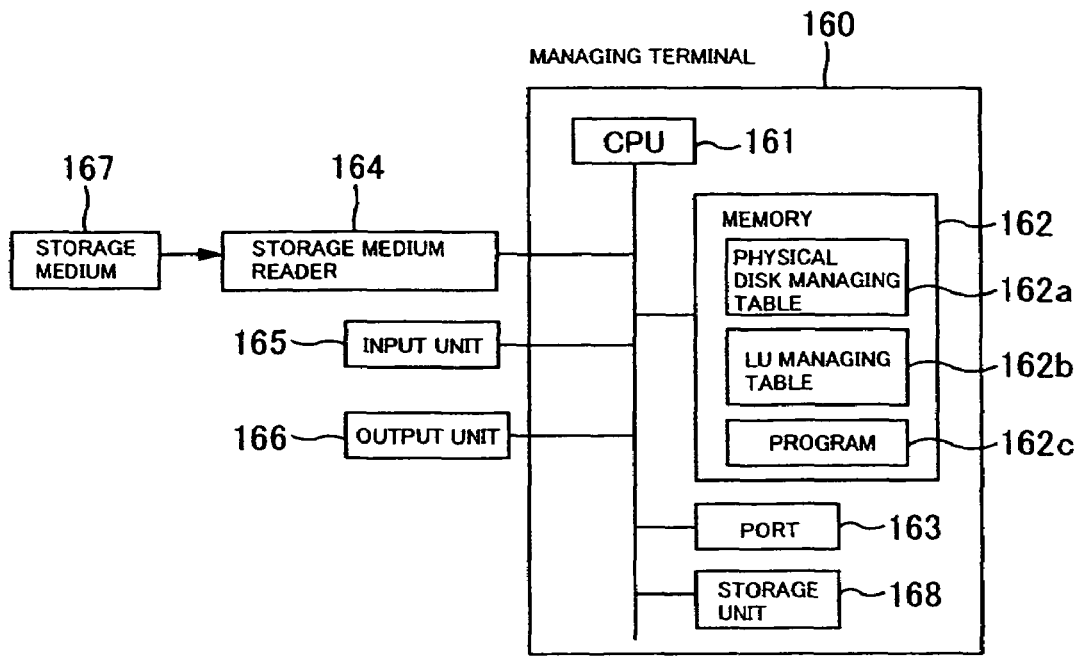
FIG. 2 is a block diagram showing the construction of a managing terminal according to the present embodiment.
FIG. 3 is a view showing a physical disk managing table according to the present embodiment.
FIG. 4 is a view showing an LU managing table according to the present embodiment.

FIG. 2 shows a construction of the managing terminal 160. The managing terminal 160 comprises a CPU 161, a memory 162, a port 163, a storage medium reader 164, an input unit 165, an output unit 166, and a storage unit 168.

The CPU 161 controls the whole managing terminal 160 and implements functions and the like as the abovementioned Web server, etc., by executing a program 162c stored in the memory 162. The memory 162 stores a physical disk managing table 162a, an LU managing table 162b, and the program 162c.

The physical disk managing table 162a is a table for managing the physical disks (disk drives) provided in a storage device/storage devices 300.

The physical disk managing table 162a is shown in FIG. 3. In FIG. 3, among the multiple physical disks provided in the storage device/storage devices 300, disk numbers #001 to #006 are shown. The capacity, RAID structure, and usage state of each physical disk are shown.

The LU managing table 162b is a table for managing the LUs set logically on the above mentioned physical disks, and is shown in FIG. 4.

In FIG. 4, among the multiple LUs set in the storage device 300, LU numbers #1 to #3 are shown. The physical disk number, capacity, and RAID structure of each LU are shown.

The storage medium reader 164 is a unit for reading programs and data stored in a storage medium 167. Read programs and data are stored in the memory 162 or the storage unit 168. Accordingly, for example, the program 162c recorded in the storage medium 167 can be read by used of the storage medium reader 164 and stored in the memory 162 or the storage unit 168. A flexible disk, a CD-ROM, DVD-ROM, DVD-RAM, a semiconductor memory, etc., can be used as the storage medium 167. Note that the program 162c may be a program for operating the managing terminal 160, a program for installing an OS 701 or an application program to a channel controller 110 or a disk controller 140, or a program for version upgrade. The storage medium reader 164 can be incorporated into the managing terminal 160 or attached thereto externally. The storage unit 168 is, for example, a hard disk unit, flexible disk unit, and a semiconductor memory unit. The input unit 165 is used for an operator, etc., to enter data, etc., into the managing terminal 160. Used as the input unit 165 is, for example, a keyboard, or a mouse. The output unit 166 is a unit for outputting information to the outside. Used as the output unit 166 is, for example, a display, or a printer. The port 163 is connected to the internal LAN 151, and thereby the managing terminal 160 can communicate with the channel controllers 110, the disk controllers 140 and the like. Further, the port 163 can be connected to the LAN 400 or a telephone line.

<<<Exterior of Storage System >>>

Figure 5:
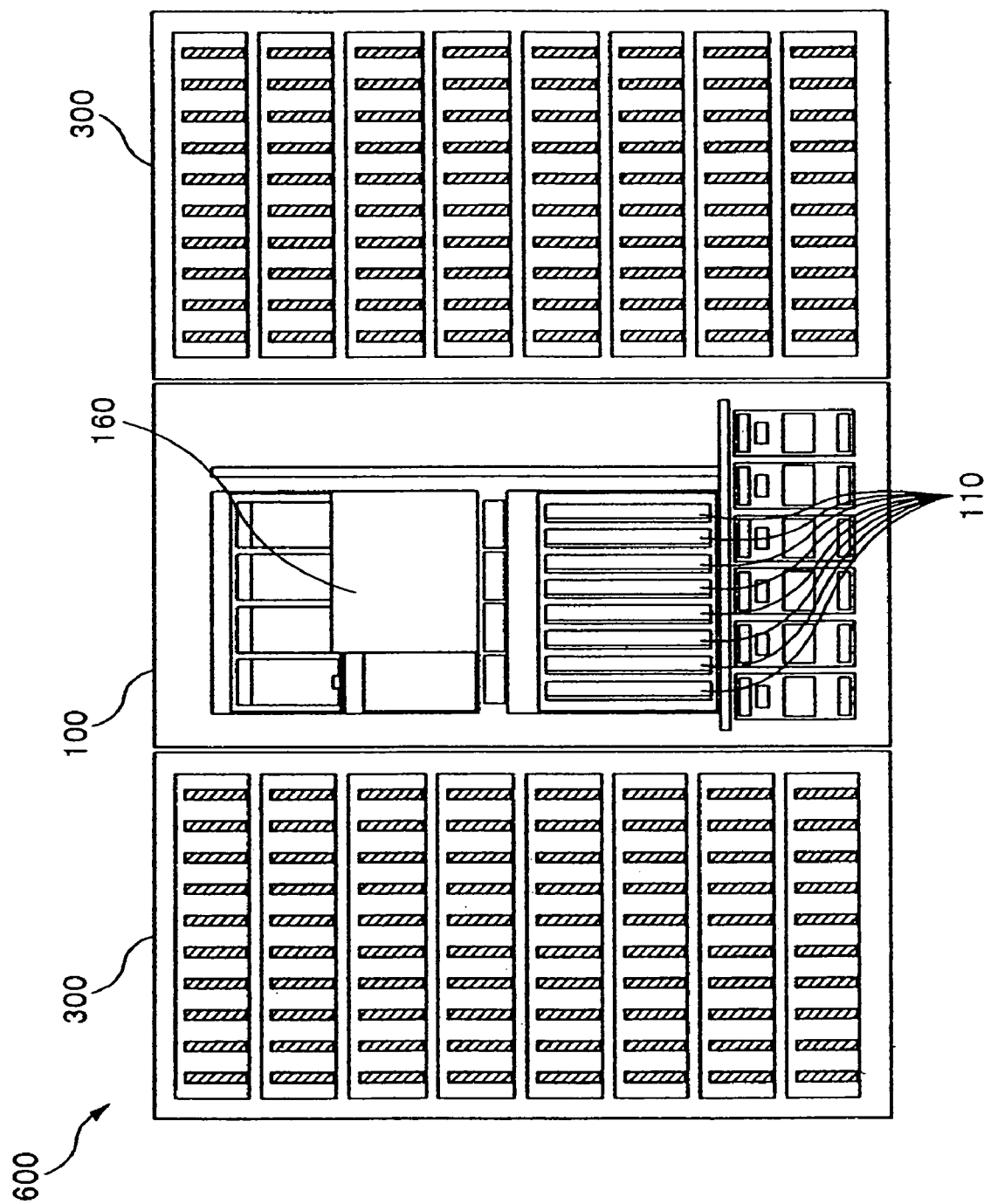
FIG. 5 is a view showing the exterior structure of the storage system according to the present embodiment.

FIG. 5 shows the exterior structure of the storage system 600 including the storage device controlling apparatus 100 according to the present embodiment. As shown in FIG. 5, the storage system 600 has the storage device controlling apparatus 100 and the storage devices 300 contained in respective chassis. The chassis for the storage devices 300 are placed on both sides of the chassis for the storage device controlling apparatus 100.

Figure 6:
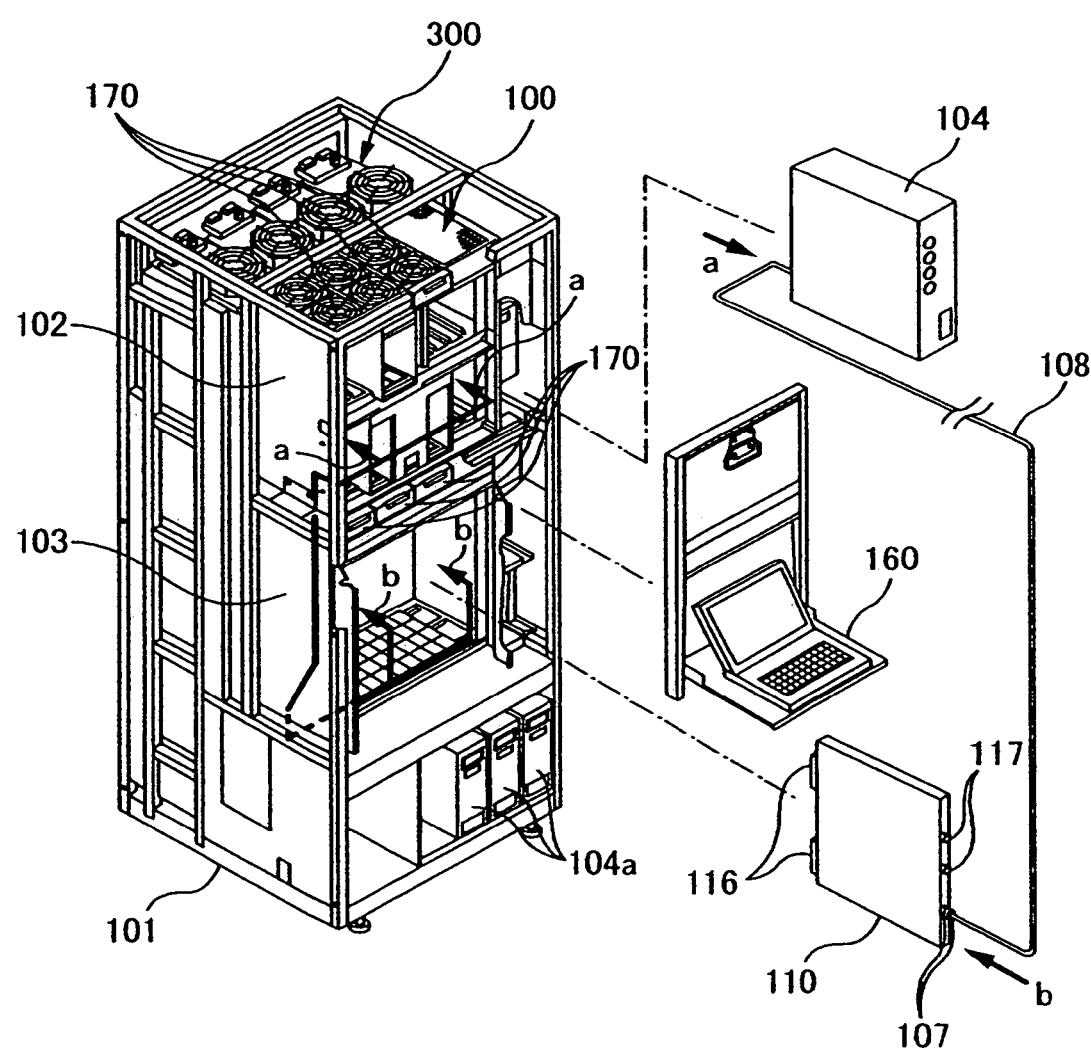
FIG. 6 is a view showing the exterior structure of a storage device controlling apparatus according to the present embodiment.

FIG. 6 shows an exterior structure of the storage device controlling apparatus 100. Specifically, FIG. 6 shows front and top faces of the storage device controlling apparatus 100 and front, top, and side faces of a chassis 101 for the storage device controlling apparatus 100. In this embodiment, the storage devices 300 are accommodated in the back side of the chassis 101 in FIG. 6. Note that another storage device controlling apparatus 100 may be accommodated in the back side of the chassis 101 symmetrically to the storage device controlling apparatus 100 for integration of the storage device controlling apparatuses 100. In this case, the storage device controlling apparatuses 100 and the storage devices 300 accommodated in a different chassis are electrically connected with cables or the like.

The storage device controlling apparatus 100 comprises the managing terminal 160 provided next to a second-shelf box 103 in FIG. 6. Note that while the managing terminal 160 shown in FIG. 6 is a so-called notebook personal computer, it may take any form.

In FIG. 6, the second-shelf box 103 of the chassis 101 is provided with slots to which the channel controllers 110 are to be attached. The board of a channel controller 110 is attached to each of the slots. The board of the channel controller 110 is a unit on which a circuit board of the channel controller 110 is formed, which is a unit attached to each slot. Each slot is provided with guide rails to attach the board of each channel controller 110. By inserting the board of the channel controller 110 into the slot along the guide rails, the channel controller 110 is integrated as part of the storage device controlling apparatus 100. By pulling the board of the channel controller 110 attached to each slot toward the front along the guide rails, the board can be removed. Further, in the back side (inner side) of the slots, a supporting section (platter) is provided. The supporting section includes connectors for electrically connecting a channel controller 110 to the storage device controlling apparatus 100 as part thereof.

Herein, the channel controllers 110 are CHNs, CHFs, and CHAs. Since the board of each channel controller 110 is compatible with the others in size and in the position and pin arrangement of its connector and the like, the eight slots can have the board of any channel controller 110 attached thereto. Therefore, for example, all the eight slots can each have the board of a CHN 110 attached thereto. Alternatively, as shown in FIG. 1, the eight slots can have the boards of four CHNs 110, the boards of two CHFs 110, and the boards of two CHAs 110 attached thereto, or some of the slots may have no channel controller 110.

In the embodiment, among the channel controllers 110 whose boards are attached to the slots, plural channel controllers 110 of the same type constitute a cluster. For example, two CHNs 110 as a pair may constitute a cluster. By constituting a cluster, even when a fault has occurred in a channel controller 110 of the cluster, another channel controller 110 in the cluster may be arranged to take over processing that the channel controller 110, where the fault has occurred, was performing until then (fail-over control).

Figure 12:
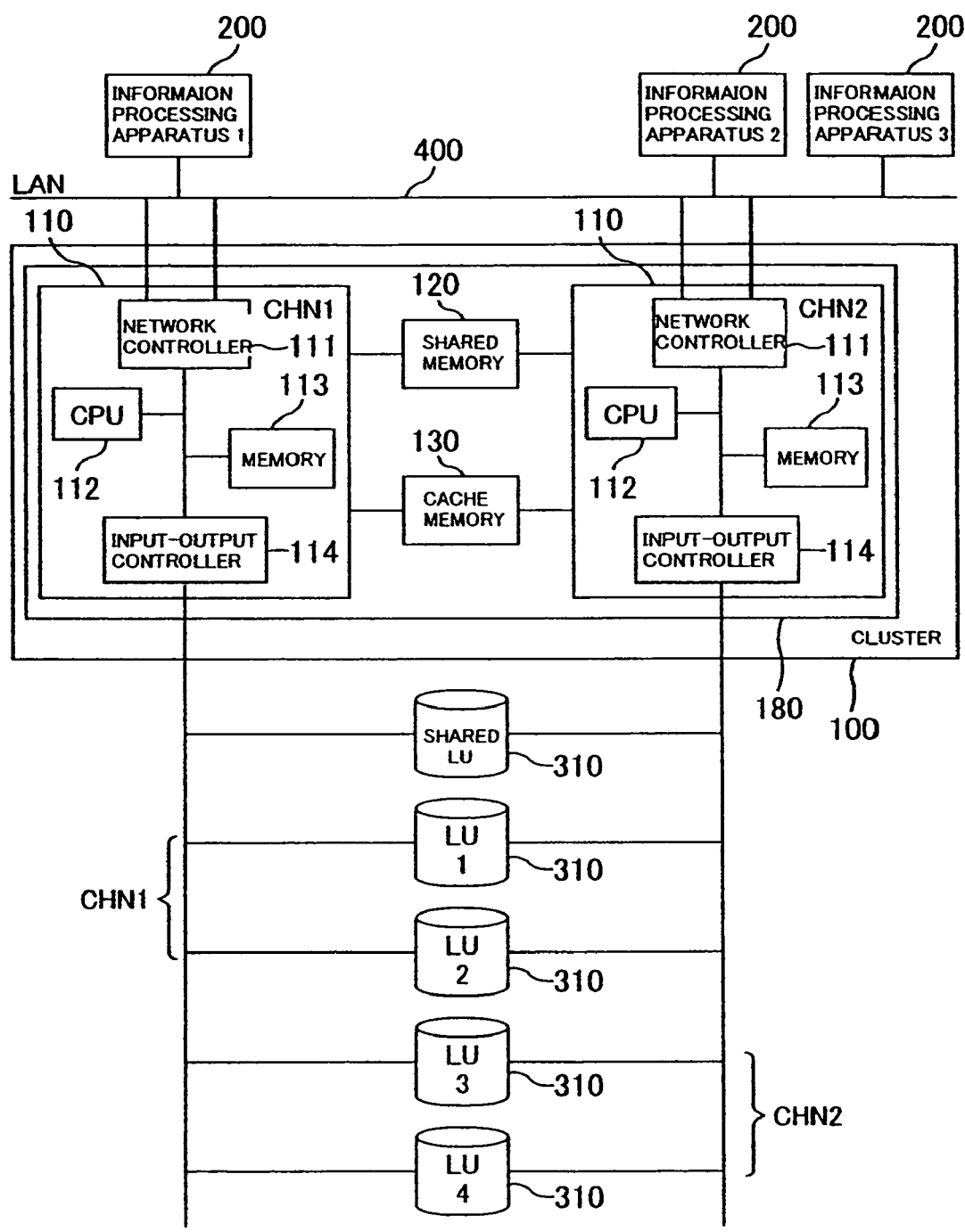
FIG. 12 is a view showing the structure of a cluster in channel controllers according to the present embodiment.

FIG. 12 shows two CHNs 110 constituting a cluster, which is described in detail later.

Note that the storage device controlling apparatus 100 has two systems of power supply to improve reliability, and the abovementioned eight slots, to which the boards of channel controllers 110 are attached, are divided into two groups of four for the respective power supply systems. Herein, when forming a cluster, the cluster is arranged to include channel controllers 110 respectively connected to both power supply systems. Thus, even if a failure occurs in one of the power supply systems to stop supplying electric power to the board of any one of the channel controllers 110, electric power continues to be supplied to the board of another channel controller 110 connected to the other power supply system forming part of the same cluster. Therefore another channel controller 110 can take over the processing from the relevant channel controller 110 (fail-over).

Other units forming part of the storage device controlling apparatus 100, such as the disk controllers 140 and the shared memory 120 in FIG. 1, are attached to the back side, etc., of the storage-device controlling apparatus 100 in FIG. 6. Batteries 104*a* provided on a bottom shelf of the chassis have a function as a backup power supply for such a shared memory 120 and the like.

The storage device controlling apparatus 100 is provided with fans (fan section) 170 for releasing heat generated in the boards of channel controllers 110, etc. The fans 170 are provided on the tops of the slots for the channel controllers 110 as well as on the top of the storage device controlling apparatus 100. The rotation speed of the fans according to the embodiment is 3,600 rpm, which increases cooling efficiency compared to the conventional storage device controlling apparatus provided with fans having a rotation speed of about 2,600 rpm.

The chassis 101 of the storage device controlling apparatus 100 will be described in detail later.

<<<Channel Controller (CHN)>>>

As previously described, the storage system 600 according to the present embodiment accepts file access requests from the information processing apparatuses 1 to 3 (200) by use of the CHNs 110, and provides service as a NAS to the information processing apparatuses 1 to 3 (200).

Figure 7:
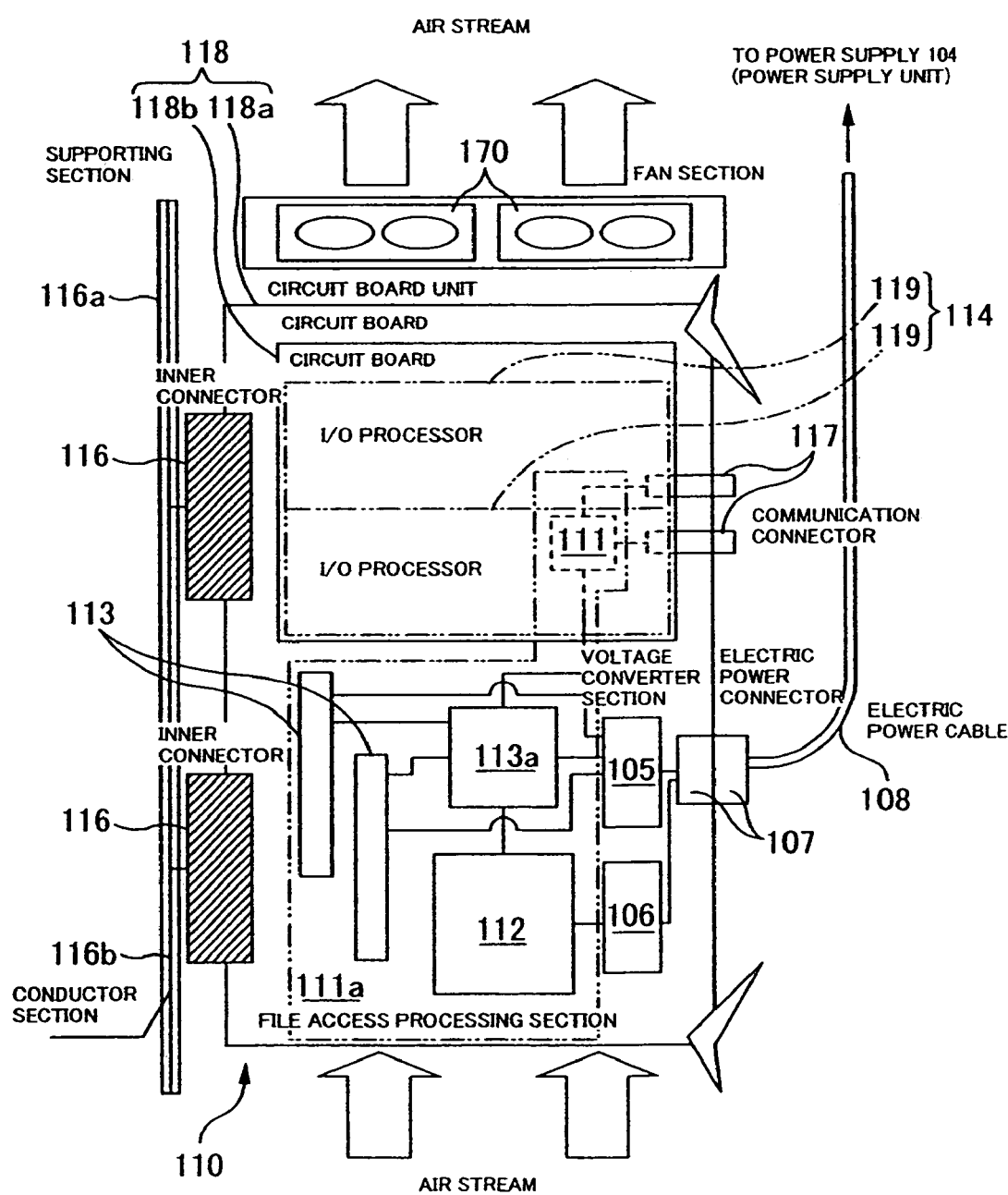
FIG. 7 is a view showing a CHN according to the present embodiment.

The hardware structure of a CHN 110 is shown in FIG. 7. FIG. 7 schematically shows the main hardware of the CHN 110 projected on a face parallel to the side face of the chassis 101 in FIG. 6. As shown in this drawing, the CHN 110's hardware is constituted as a unit. Hereinafter, this unit is also referred to as a NAS board. The NAS board according to the embodiment includes an integrally unitized board 118 having two circuit boards 118*a* and 118*b*, which are in parallel with each other and overlapped in the upper side of FIG. 7.

The circuit boards 118*a* and 118*b* are connected with each other to constitute a unit. This unit can be integrally attached to the storage device controlling apparatus 100. In the present embodiment, this kind of unit comprising the plural circuit boards 118*a* and 118*b* is included in the concept of the same board 118.

In other words, in the present embodiment, the circuit boards 118*a* and 118*b* have the same meaning as the board (circuit board unit) 118 in which the circuit boards are integrally unitized (namely, the circuit board and the circuit board unit have the same meaning). Therefore, the NAS board may be the circuit board 118*a* or 118*b* itself or may be the board (circuit board unit) 118 in which the circuit boards are integrally unitized.

More specifically, the CHN 110 mainly includes a file access processing section 111*a* and the input/output (I/O) processors 119. The file access processing section 111*a* includes a network interface section 111 to be described later and is formed in the lower side of the circuit board 118*a* in FIG. 7. The I/O processors 119 are included in an input-output controller 114 to be described later and formed in the circuit board 118*b* located in the upper side of the circuit board 118*a* in FIG. 7.

The channel controller (CHN) 110 will be described in detail later together with the chassis 101 of the storage device controlling apparatus 100.

<<<Channel Controller (CHF and CHA)>>>

Figure 8:
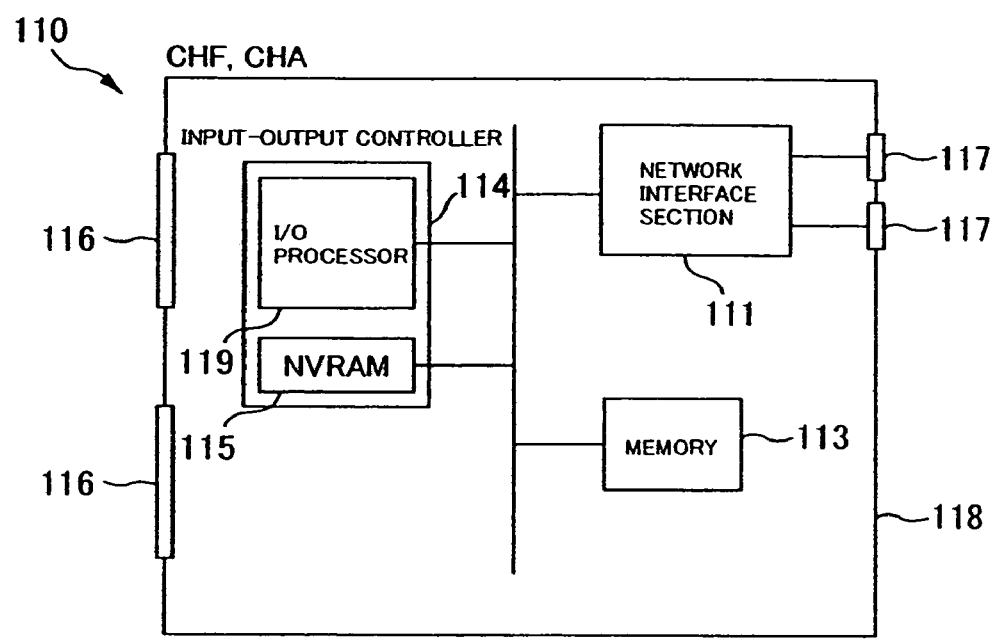
FIG. 8 is a view showing a CHF and CHA according to the present embodiment.

The hardware structures of the CHF 110 and the CHA 110 are shown in FIG. 8. The board for CHF 110 and the CHA 110 are also formed as a board integrally unitized in the same way as the board for CHN 110. Similar to the board for CHN 110, the board 118 may be constructed from a plurality of circuit boards which are integrally formed. Further, the boards for the CHF 110 and the CHA 110 are compatible with the board for the CHN 110 in terms of size, position and pin arrangement of the board connecting connector 116 and the like.

The CHF 110 and the CHA 110 comprise a network interface section 111, a memory 113, an input-output controller 114, an I/O processor 119, an NVRAM 115. Each board on which these are formed includes board connecting connectors 116, and communication connectors 117.

The network interface section 111 comprises a communication interface for communicating with the information processing apparatuses 200. In the case of a CHF 110, the communication interface receives block access requests sent from the information processing apparatuses 200 according to, for example, the Fibre Channel protocol. In the case of a CRA 110, the communication interface receives block access requests sent from the information processing apparatuses 200 according to, for example, FICON (registered trademark), ESCON (registered trademark), ACONARC (registered trademark), or FIBARC (registered trademark) protocol. The communication connector 117 is a connector for communicating with the information processing apparatuses 200. In the case of a CHF 110, the communication connector 117 is a connector that can be connected to the SAN 500 and complies with, for example, the Fibre Channel. In the case of a CHA 110, the communication connector 117 is a connector that can be connected to the information processing apparatus 5 and complies with, for example, FICON (registered trademark), ESCON (registered trademark), ACONARC (registered trademark), or FIBARC (registered trademark).

The input-output controllers 114 control all the CHFs 110 and CHAs 110 and send and receive data and commands to and from the disk controllers 140, the cache memory 130, the shared memory 120, and the managing terminal 160. By executing various programs stored in the memory 113, the functions of the CHFs 110 and CHAs 110 according to the present embodiment are implemented. The input-output controller 114 comprises the I/O processor 119 and the NVRAM 115. The I/O processor 119 controls the sending and receiving of data and commands. The NVRAM 115 is a nonvolatile memory storing a program to control the I/O processor 119. The contents of a program stored in the NVRAM 115 can be written or rewritten according to instructions from the managing terminal 160 or the NAS manager 706 described later.

<<<Disk Controller>>>

Figure 10:
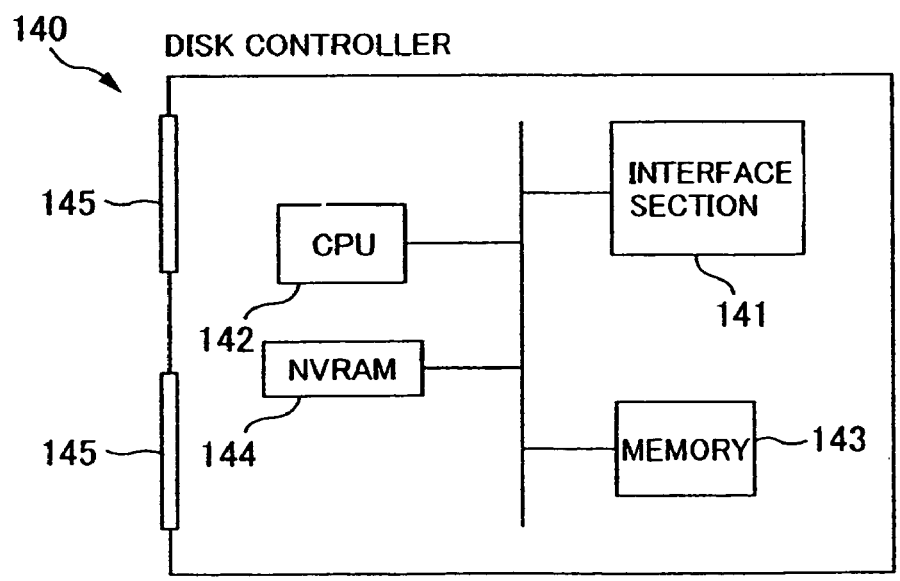
FIG. 10 is a view showing a disk controller according to the present embodiment.

FIG. 10 shows the hardware structure of a disk controller 140.

The disk controller 140 is formed as an integrally unitized board. The board of the disk controller 140 includes an interface section 141, a memory 143, a CPU 142, and an NVRAM 144 formed thereon and further provided with board connecting connectors 145. These are formed on the board to be an integrally unitized circuit board.

The interface section 141 comprises a communication interface for communicating with the channel controllers 110, etc., via the connecting section 150, and a communication interface for communicating with the storage device 300.

The CPU 142 controls the entire disk controller 140 and communicates with the channel controllers 110, the storage device 300, and the managing terminal 160. By executing various programs stored in the memory 143 and the NVRAM 144, the functions of the disk controller 140 according to the present embodiment are implemented. The functions implemented by the disk controller 140 are the control of the storage device 300, RAID control, and duplication management, backup control, remote copy control, and the like of data stored in the storage device 300.

The NVRAM 144 is a nonvolatile memory storing a program to control the CPU 142. The contents of a program stored in the NVRAM 144 can be written or rewritten according to instructions from the managing terminal 160 or the NAS manager 706 described later.

The disk controller 140 is electrically connected to the storage device controlling apparatus 100 by engaging the aforementioned board connecting connectors 145 with the connectors on the storage device controlling apparatus 100.

<<<Software Structure>>>

Figure 11:
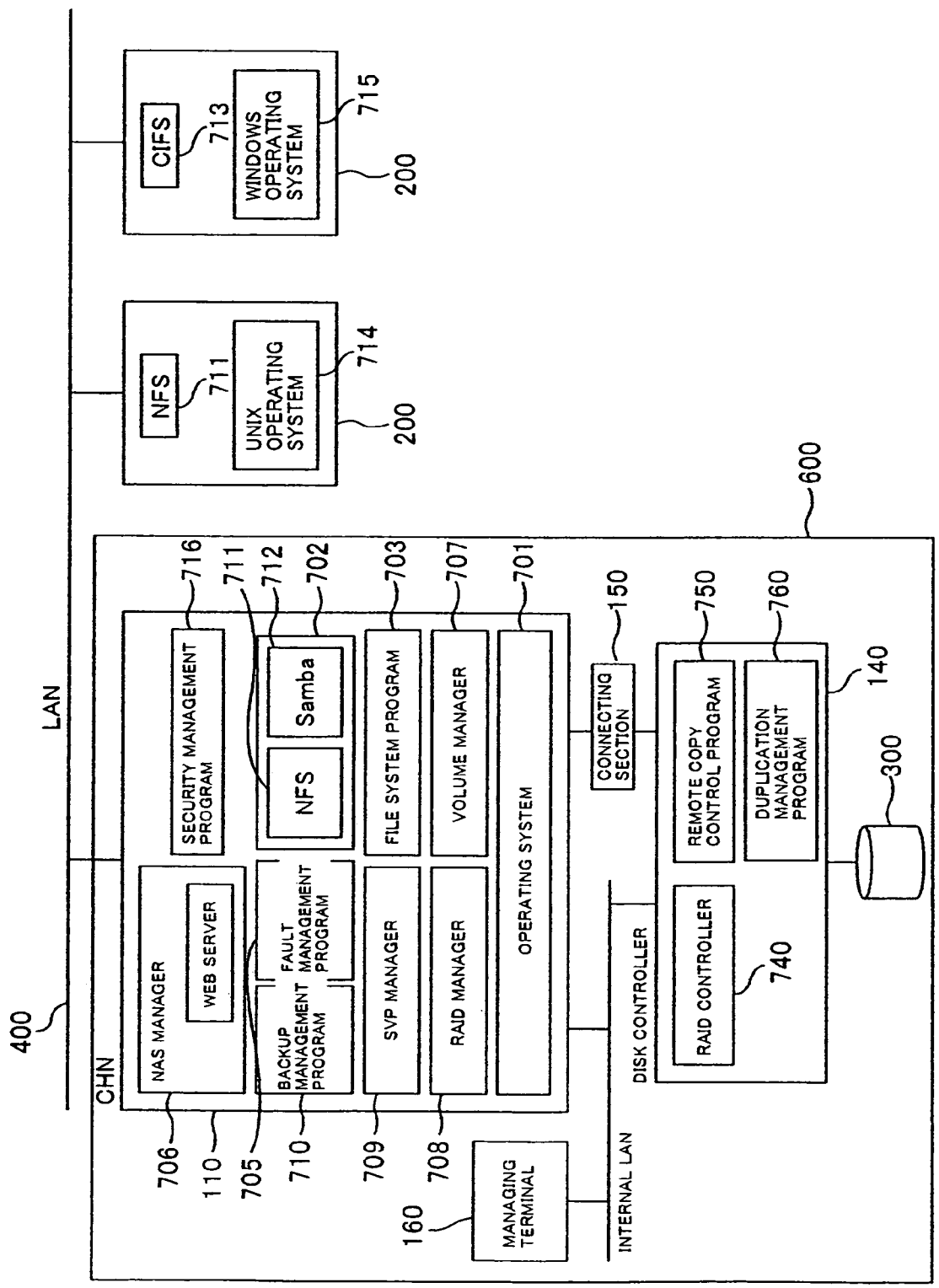
FIG. 11 is a view showing the structure of software according to the present embodiment.

The software structure in the storage system 600 in the present embodiment is shown in FIG. 11. Software running on an operating system 701 includes a RAID manager 708, a volume manager 707, an SVP manager 709, a file system program 703, a network controller 702, a backup management program 710, a fault management program 705, an NAS manager 706 and the like.

The RAID manager 708 running on the operating system 701 provides functions to set parameters for the RAID controller 740 and to control the RAID controller 740. The RAID manager 708 accepts parameters and control instruction information from the operating system 701, other applications running on the operating system 701, or an SVP. The RAID manager 708 then sets the accepted parameters into the RAID controller 740 and sends control commands corresponding to the control instruction information to the RAID controller 740.

Herein, the set parameters include, for example, parameters for defining storage devices (physical disks) forming a RAID group (specifying RAID group's structure information, stripe size, etc.), parameters for setting a RAID label (for example, 0, 1, 5), and the like. Examples of the control commands which the RAID manager 708 sends to the RAID controller 740 are commands instructing to configure and delete a RAID and to change the capacity thereof, a command requesting structure information of each RAID group, and the like.

The volume manager 707 provides the file system program 703 with virtualized logical volumes obtained by further virtualizing LUs provided by the RAID controller 740. A virtualized logical volume is composed of one or more logical volumes.

The main function of the file system program 703 is to manage the correspondence between names of files designated in file access requests received by the network controller 702 and addresses on the virtualized logical volumes where the files are stored. For example, the file system program 703 identifies an address on the virtualized logical volume corresponding to a file name designated by a file access request.

The network controller 702 includes two file system protocols of an NFS (Network File System) 711 and a Samba 712. The NFS 711 accepts a file access request from a UNIX-based information processing apparatus 200 on which the NFS 711 is running. The Samba 712 accepts a file access request from a Windows-based information processing apparatuses 200 on which a CIFS (Common Interface File System) 713 is running. The UNIX and the Windows are registered trademarks.

The NAS manager 706 is a program for confirming, setting, and controlling the operation state of the storage system 600. The NAS manager 706 has a function as a Web server and provides a setup Web page for the information processing apparatuses 200 to set and control the storage system 600 from the information processing apparatuses 200. The setup Web page is provided by the NAS manager 706 running in each of the channel controllers 1 to 4 (110). The NAS manager 706 sends data of the setup Web page to the information processing apparatuses 1 to 3 (200) in response to HTTP (hypertext transport protocol) requests from the information processing apparatuses 1 to 3 (200). By use of the setup Web page displayed on the information processing apparatuses 1 to 3 (200), a system administrator or the like instructs setting and control of the storage system 600.

The NAS manager 706 receives data concerning the setting and control sent from the information processing apparatuses 200 due to the operation on the setup Web page and performs the setting and control corresponding to the received data. Thus, various settings and controls of the storage system 600 can be performed from the information processing apparatuses 1 to 3 (200). Moreover, the NAS manager 706 notifies the OS and the application programs running on the channel controllers 110, the disk controllers 140, and the like of the contents of settings set in the setup Web page. The contents of settings set in the setup Web page is managed by a shared LU 310 in some cases.

Things that can be done by use of the setup Web page of NAS manager 706 are, for example, LU management and setting (capacity management, capacity expansion and reduction, user assignment, etc.); the setting and control (setting of the addresses of the to-be-copied and the to-be-copied-into) concerning functions such as duplication management and remote copy (replication); the setting and control of the backup management program 710 described later; the management of redundantly structured clusters of CHNs, CHFs and CHAs (setting of the correspondence between the channel controllers, whereby, when one fails, another fails over; a fail-over method; etc.); version management of the OS and application programs running on the OS; and the management and setting of the operation state of a security management program 716 providing functions concerning security of data, such as a virus detection program and virus extermination.

The backup management program 710 is a program for backing up data stored in the storage devices 300 via LAN or SAN. The backup management program 710 provides a function of a NDMP (Network Data Management) protocol and communicates, according to the NDMP, with backup software complying with the NDMP operating on an information processing apparatus 200 via the LAN 400. When a backup device 910 is connected to the information processing apparatus 200 via a SCSI, etc., data to be backed up is once read by the information processing apparatus 200 and sent to the backup device 910. When the backup device 910 is connected to the LAN 400, data to be backed up may be transferred to the backup device 910 from the storage system 600 directly without an information processing apparatus 200.

The fault management program 705 is a program for controlling fail-over between the channel controllers 110 which form a cluster.

In FIG. 12, a cluster 180 constituted of two CHNs 110 is shown. FIG. 12 shows a case where the cluster 180 is composed of the CHN 1 (channel controller 1) 110 and the CHN 2 (channel controller 2) 110.

As previously mentioned, the fail-over processing is performed between the channel controllers 110 constituting the cluster 180. That is, if any fault occurs in CHN 1 (110) and it becomes impossible to continue a processing, the CHN 2 (110) takes over the processing that has been performed by the CHN 1 (110). The fault management program 705 executed by the CHN 1 (110), and the CHN 2 (110) implements the fail-over processing.

Both CHN 1 (110) and CHN 2 (110) execute the fault management program 705, write in the shared memory 120 to indicate that the processing thereof is normally performed, and confirm each other whether the other has written. When one cannot detect the writing by the other, the one determines that a fault has occurred in the other and performs fail-over processing. In the fail-over processing, the processing that has been performed by the other is taken over via a shared LU 310.

The fail-over may be automatically performed in such a manner, and also manually performed by an operator by operating the managing terminal. In another case, a user may manually perform the fail-over from an information processing apparatuses 200 by use of the setup Web page provided by the NAS manager 706. The manual fail-over is performed in cases where hardware (for example, a NAS board) of the channel controller 110 needs to be changed because of the end of life, version up, periodic diagnosis, and the like.

The SVP manager 709 provides the managing terminal 160 with various services according to requests from the managing terminal 160. For example, the SVP manager 709 provides the managing terminal 160 with the contents of various settings concerning the storage system 600 such as the settings of LUS and RAIDs and reflects the various settings concerning the storage system 600 entered from the managing terminal 160.

The security management program 716 implements functions such as detection of computer viruses, monitoring intrusion thereof, update management of the computer virus detection program, extermination of viruses of an infected computer, and firewall.

===Details of Chassis and NAS board===
<<<Chassis>>>

In FIG. 6, a power supply (power supply unit) 104 for supplying electric power to the CHN 110 is provided in a first-shelf box 102 of the chassis 101. This power supply 104 supplies electric power with a DC voltage of 12 V for a memory controller and a CPU, to be described later, which are provided in the CHN 110. The memory controller and the CPU are provided in a file access processing section 111*a* described later. The electric power with a DC voltage of 12 V is supplied from the front side (outer side) of the chassis 101 via a cable (electric power cable) 108 and a power supply connector (electric power connector) 107, which are indicated by arrows a and b in FIG. 6, respectively.

Meanwhile, an I/O processor 119 to be described later and the like provided in the CHN 110 are supplied with electric power with DC voltages of 3.3 V and 5 V from the power supply 104. In FIG. 6, this electric power is supplied via the connectors provided on supporting sections (platters) and via the board connecting connectors (inner connectors) 116 provided on the board of the CHN 110. Herein, the supporting sections are respectively provided on the back sides of the first-shelf and second-shelf boxes 102 and 103.

The supporting sections of the both boxes 102 and 103 have a layered structure including a layer of epoxy resin and a layer of a copper film. Herein, at least part of the copper film layer acts as a power supply line 116*b* shown in FIG. 7, through which the electric power with DC voltages of 3.3 V and 5 V are supplied from the power supply 104 to the connectors. Between the two supporting sections, a bus bar composed of a copper board-like member is provided. These power supply line 116*b* and the bus bar constitute a conductor section from the power supply 104 to the CHN 110. The electric power is supplied through this conductor section from the power supply 104 to the CHN 110 while suppressing electric current loss as much as possible.

Incidentally, for the storage device controlling apparatus 100 and the storage devices 300 accommodated in the chassis 101, apparatuses having conventional structures can be utilized, for example, commercially available SAN-compliant apparatuses. Especially when the connectors of the board of the CHN 110 are shaped so as to be attached as they are to slots provided in a chassis of the conventional structure, the apparatus having the conventional structure can be easily utilized. In other words, the storage system 600 according to the present embodiment can be easily structured by utilizing existing products.

<<<NAS Board>>>

The file access processing section 111*a* in FIG. 7 mainly has a function to accept file access requests from the information processing apparatuses 200 via the LAN 400 in FIG. 1. For implementing such a function, the file access processing section 111*a* in the embodiment includes a network interface section 111, a memory controller 113*a*, a CPU 112, and a memory 113.

As shown in FIG. 7, the network interface section 111 is connected to the communication connectors (connectors for communication) 117 and the memory controller 113*a*. The network interface section 111 acts as an interface between the communication connectors 117 and the memory controller 113*a*. The network interface section 111 in the embodiment is formed on the circuit board 118*a* and located in a gap between the both circuit boards 118*a* and 118*b*. There are two communication connectors 117 provided on the right side of the circuit board 118a in FIG. 7. Herein, the right side in FIG. 7 corresponds to the outer side, namely, the front side of the chassis 101 in FIG. 6. The communication connectors 117 are connected to the information processing apparatuses 200 in FIG. 1 via the LAN 400. Furthermore, the communication connectors in the embodiment support the Ethernet (registered trademark).

Note that, for the communication connectors 117 in the embodiment, a connector for communication provided on a board of a conventional structure, mainly composed of the I/O processors 119 to be described later, can be used as it is. The conventional structure may be a structure commercially available as a SAN compliant one, for example.

The memory controller 113a is connected to the memories 113 and the CPU 112. The memory controller 113a is formed in a generally horizontal center on the lower side of the circuit board 118a in FIG. 7. The memory controller 113a has functions to control data transfer between the memory 113 and the communication connector 117 via the network interface 111 and to control data transfer between the memory 113 and the CPU 112. In the present embodiment, a voltage of 2.5 V is applied to the memory controller 113a from a first DC-DC converter (voltage converter section) 105. This first DC-DC converter 105 is formed in the lower right side (outer side of the chassis 101 in FIG. 6) of the circuit board 118a in FIG. 7 and converts the voltage of 12 V inputted from the power supply 104 into the voltage of 2.5 V for output.

The CPU 112 is formed in the generally horizontal center on the lower side of the circuit board 118a in FIG. 7 and controls the board of the CHN 110 to function as a NAS board. In the embodiment, a voltage of 1.3 V is applied to the CPU 112 by a second DC-DC converter (voltage converter section) 106. This second DC-DC converter 106 is formed on the lower right side (outer side of the chassis 101 in FIG. 6) of the circuit board 118a in FIG. 7 and converts the voltage of 12 V inputted from the power supply 104 into the voltage of 1.3 V for output.

Figure 9:
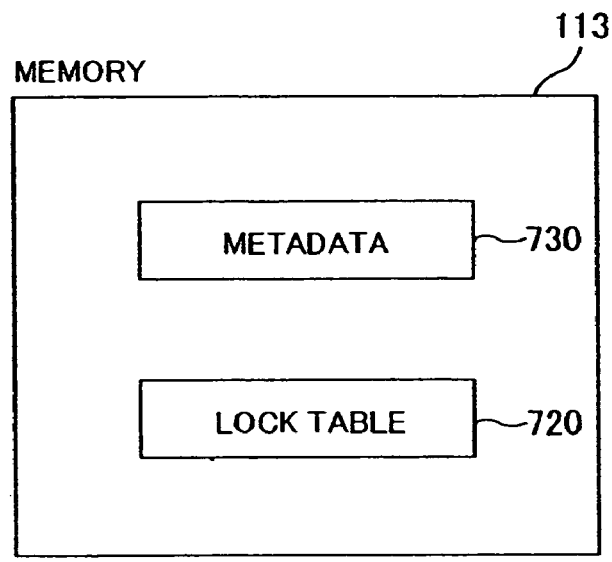
FIG. 9 is a view for explaining the contents of data stored in a memory according to the present embodiment.

There are two memories 113 formed on the lower left side (inner side of the chassis 101 in FIG. 6) of the circuit board 118a in FIG. 7. The memories 113 store various programs and data, for example, metadata 730 and a lock table 720 shown in FIG. 9 and various programs such as a NAS manager 706 shown in FIG. 11. The metadata 730 is information created so as to correspond to respective files managed by a file system. The metadata 730 includes, for example, information for identifying the storage location of each file such as the address on LU where the file data is stored and the data size. The metadata may also include information such as the file capacity, owner, and update time of each file. The metadata 730 may include information created so as to correspond not only to files but also to directories.

An example of the metadata 730 is shown in FIG. 13. The metadata 730 is also stored in each LU on the storage devices 300.

The lock table 720 is a table for performing exclusive control on file accesses from the information processing apparatuses 1 to 3 (200). The exclusive control allows the information processing apparatuses 1 to 3 (200) to share files.

In FIG. 14, the lock table 720 is shown. As shown in FIG. 14, the lock table 720 includes a file lock table 721 and an LU lock table 722. The file lock table 721 is a table showing whether each file is locked or not. When an information processing apparatus 200 has opened a file, the file is locked, to which access from other information processing apparatuses 200 is prohibited. The LU rock table 722 is a table showing whether each LU is locked or not. When an information processing apparatus 200 is accessing an LU, the LU is locked, to which access from other information processing apparatuses 200 is prohibited.

In the present embodiment, a voltage of 2.5 V is applied to the memories 113 by the first DC-DC converter 105.

Meanwhile, the input-output controller 114 shown in FIG. 7 sends and receives data and commands to and from the disk controllers 140, the cache memory 130, the shared memory 120, and the managing terminal 160 in FIG. 1. The input-output controller 114 comprises the I/O processors 119 and the NVRAM. Each I/O processor 119 is constituted by a one-chip microcomputer, for example. The I/O processor 119 controls the sending and receiving of data and commands and relays communication between a CPU 112 and the disk controllers 140. In the embodiment, there are two I/O processors 119 formed on the circuit board 118b. The NVRAM is a nonvolatile memory storing a program to control the I/O processors 119. Contents of the program stored in the NVRAM can be written or rewritten according to instructions from the managing terminal 160 and the NAS manager 706 shown in FIGS. 1 and 6 respectively.

The voltage of 12 V from the power supply 104 is supplied to the CHN 110 through the power supply connectors 107 and the cable 108 in FIGS. 6 and 7. The power supply connectors 107 are provided on the right end (end to be located on the outer side of the chassis) of the circuit board 118a in FIG. 7.

The I/O processors 119 and the like are supplied with electric power from a DC-DC converter properly formed on the board 118. The properly formed DC-DC converter is supplied with electric power with voltages of 3.3 V and 5 V from the power supply 104 via the board connecting connectors (inner connectors) 116 provided on the left end of the circuit board 118a in FIG. 7 and via the power supply line 116b in the supporting section 116a. Furthermore, the board connecting connectors 116 have not only a function to supply electric power to the I/O processors 119 and the like, but also a function to connect the I/O processors 119 and the internal LAN 151 in FIG. 1 and the like.

In the present embodiment, the voltage applied to the CPU 112 is 1.3 V, and the electric current in the CPU 112 in operation fluctuates largely. However, it is difficult to handle the current fluctuation in the CPU 112 with the electric power with the voltages of 3.3 V and 5 V supplied through the board connecting connectors 116. Accordingly, in order to handle the above large current fluctuation, the electric power with a voltage of 12 V is required and supplied through the power supply connectors 107.

As previously described, the fans 170 are respectively provided above the slots for the channel controllers 110 and in the top face of the chassis 101. By these fans 170, an air current is generated in a direction from the bottom to the top as indicated by arrows in FIG. 7 to cool down the hardware of the CHN 110. Above the slots for the channel controllers 110, two fans 170 are provided for each of the boards of the channel controllers 110.

In the embodiment, the conventional structure mainly composed of an I/O processor, for example, a structure commercially available as the SAN-compliant one can be applied to the board 118 having the board connecting connectors 116. In the board (NAS board) of the CHN 110 according to the embodiment, the file access processing section 111a is newly provided for the conventional structure, and the power supply connectors 107 are provided on the right end of the circuit board 118a in FIG. 7. The communication connectors 117 connecting the file access processing section 111a and the information processing apparatuses 200 are also provided on the right end of the circuit board 118a in FIG. 7. Accordingly, there is little need to modify the conventional board connecting connectors 116 for supplying electric power to the file access processing section 111a newly formed. Hence, this board (NAS board) of the CHN 110 can be attached as it is to the slot provided in the chassis of the conventional structure, thus facilitating the use of the apparatuses of the conventional structures. In other words, the storage device controlling apparatus 100 according to the present embodiment can be easily structured by use of the existing products. Consequently, it is possible to provide the storage device controlling apparatus 100 and the board (NAS board) of the CHN 110 which are compact and low in cost, and put fewer burdens on users when expanding a system. By being made compact, the storage device controlling apparatus 100 achieves relatively high-density mounting.

For example, if the supporting sections provided with the existing chassis having the conventional structure includes the aforementioned power supply line of a copper film layer for supplying electric power to the I/O processors 119 and the like, it is not easy to add to the supporting section a similar power supply line newly provided for the file access processing section 111a. Therefore, since the storage device controlling apparatus 100 and the board (NAS board) of the CHN 110 according to the embodiment can use an existing chassis without addition like this, the cost is low and fewer burdens are put on users in system expansion.

In the board 118 of the embodiment, the power supply connectors 107 for supplying the electric power to the file access processing section 111a is provided on the opposite side to the board connecting connectors 116 for supplying the electric power to the I/O processors 119 and the like. Therefore, the file access processing section 111a is prevented from being arranged in the vicinity of the I/O processors 119. Herein, especially the memory controller 113a and the CPU 112, included in the file access processing section 111a, and the I/O processors 119 are heating elements. In the embodiment, such arrangement of the connectors 107 and 116 makes the space between the heat generators wide. When the air current is generated by the fans 170 in the space, the efficiency of cooling these heating elements is increased. Therefore, operations of the storage device controlling apparatus 100 are stabilized.

Furthermore, in the embodiment, air is flown by the fans 170 in a direction from the bottom to the top. Therefore, in the board 118, temperature in the lower side is lower than that in the upper side. Accordingly, the I/O processors 119 are arranged on the upper side of the board 118, and the memory controller 113a and the CPU 112, whose heat release values are higher than that of the I/O processors 119, are arranged on the lower side of the board 118. This enables the entire board (NAS board) of the CHN 110 to be efficiently cooled, and the operations of the storage device controlling apparatus 100 are stabilized.

In addition, in the embodiment, since the air is flown by the fans 170 through the gap between the paired circuit boards 118a and 118b, the entire board (NAS board) of the CHN 110 is cooled more efficiently, so that the operations of the storage device controlling apparatus 100 are further stabilized.

As previously described, in the board 118 according to the embodiment, the power supply connectors 107 for supplying electric power to the file access processing section 111a are provided on the opposite side to the board connecting connectors 116 for supplying electric power to the I/O processors 119 and the like. Herein, assumed is a case where the first and second DC-DC converters 105 and 106 and the DC-DC converter properly formed for the I/O processors 119 and the like are separately arranged in the vicinity of the power supply connectors 107 and in the vicinity of the board connecting connectors 116, respectively. By arranging the connectors 107 and 116 separately in such a manner, separate arrangement of the DC-DC converters 105 and 106 and the properly-formed DC-DC converter is realized. In the present embodiment, the DC-DC converters 105 and 106 are located between the memory controller 113a and the CPU 112; which constitute the file access processing section 111a, and the power supply connectors 107, in the horizontal direction in FIG. 7. Therefore, these DC-DC converters 105 and 106 are spaced from the DC-DC converters properly formed for the I/O processors 119 and the like. Herein, generally, a DC-DC converter is likely to generate high frequency waves and cause noises and a ground level shift to electrical signals in the communication connectors 117 and the board connecting connectors 116. Accordingly, the separate arrangement of the DC-DC converters 105 and 106 and the properly formed DC-DC converters according to the embodiment can separate the sources of the noises and shift. The operations of the storage device controlling apparatus 100 are thus stabilized.

In the embodiment, since the voltage of 12V is applied to the power supply connector 107 from the power supply 104 by the easy means of the cable 108, the storage device controlling apparatus 100 and board (NAS board) of the CHN 110 can be provided at low cost.

===Other Embodiments===

In the above described embodiment, the electric power is supplied to the power supply connectors 107 from the power supply 104 via the cable 108, but it should not be limited to this. For example, the cable 108 may be directly connected to the DC-DC converters 105 and 106 and the like without the power supply connectors 107.

Furthermore, in the above described embodiment, the file access processing section 111a and the I/O processors 119 of the board (NAS board) of the CHN 110 are separately formed on the board 118 composed of the paired two circuit boards 118a and 118b, which are overlapped on each other in parallel, but should not be limited to this. If the file access processing section 111a, the I/O processor 119, and the like are miniaturized, these all units may be formed on, for example, one circuit board 118a.

According to the present invention, the storage devices controlling apparatus can realize high-density mounting and low cost, put fewer burdens on users when expanding a system, and ensure the stable operations.

Although the preferred embodiment of the present invention has been described in detail, it should be understood that various changes, substitutions and alterations can be made therein without departing from spirit and scope of the inventions as defined by the appended claims.

What is claimed is:

1. A storage device controlling apparatus configured to be coupled to a storage device storing data and coupled to an information processing apparatus via a network, the storage device controlling apparatus being accommodated in a chassis, said storage device controlling apparatus comprising a circuit board accommodated in said chassis, said circuit board including:

an I/O processor formed thereon, the I/O processor being configured to output to said storage device I/O requests;

a first connector located on said chassis, at least said I/O processor and a power supply unit being connected through the first connector;

a file access processing section formed thereon, the file access processing section configured to accept requests to input and output data on a file basis from the information processing apparatus, and configured to send the I/O requests to the I/O processor;

a second connector located on said chassis, electric power being supplied to said file access processing section through the second connector;

a plurality of circuit board sections overlapped on each other in parallel to constitute a circuit board unit, wherein said file access processing section and said I/O processor are formed in the circuit board sections separately from each other, wherein said chassis includes a fan section which creates an air stream in said circuit board accommodated therein.

2. A storage device controlling apparatus according to claim 1, wherein said chassis includes a supporting section which supports said circuit board through said first connector, and said supporting section includes part of a conductor section through which electric power is supplied from said power supply unit to at least said I/O processor.

3. A storage device controlling apparatus according to claim 1, wherein said circuit board further includes a communication connector located on said chassis, and said file access processing section and said information processing apparatus are connected through said communication connector.

4. A storage device controlling apparatus according to claim 1, wherein said file access processing section is formed on an upstream side of said air stream in said circuit board.

5. A storage device controlling apparatus according to claim 1, wherein, in said circuit board, a voltage converter section is formed between said file access processing section and said second connector, the voltage converter section reducing a voltage inputted from said power supply unit to supply the reduced voltage to said file access processing section.

6. A storage device controlling apparatus according to claim 1, wherein electric power is supplied from said power supply unit to said second connector via an electric power cable.

7. A storage device controlling apparatus according to claim 2, wherein said circuit board further includes a communication connector located on said chassis, and said file access processing section and said information processing apparatus are connected through said communication connector.

8. A circuit board for a storage device controlling apparatus coupled to a storage device storing data and coupled to an information processing apparatus via a network, the storage device controlling apparatus and the circuit board being accommodated in a chassis, said circuit board comprising:

an I/O processor formed thereon, the I/O processor being configured to output to said storage device I/O requests;

a first connector located on said chassis, at least said I/O processor and a power supply unit being connected through the first connector;

a file access processing section formed thereon, the file access processing section configured to accept requests to input and output data on a file basis from the information processing apparatus, and configured to send the I/O requests to the I/O processor; and a second connector located on said chassis, electric power being supplied to said file access processing section through the second connector, wherein said chassis includes a fan section for creating an air stream in said circuit board accommodated therein, wherein a plurality of circuit board sections overlapped on each other in parallel to constitute the circuit board, and said file access processing section and said I/O processor are formed in the circuit board sections separately from each other.

9. A circuit board for the storage device controlling apparatus according to claim 8, wherein said chassis includes a supporting section which supports said circuit board with said first connector, and said supporting section includes part of a conductor section through which electric power is supplied from said power supply unit to at least said I/O processor.

10. A circuit board for the storage device controlling apparatus according to claim 8, further comprising a communication connector located on said chassis, wherein said file access processing section and said information processing apparatus are connected through said communication connector.

11. A circuit board for the storage device controlling apparatus according to claim 8, wherein said file access processing section is formed on an upstream side of said air stream.

12. A circuit board for the storage device controlling apparatus according to claim 8, further comprising a voltage converter section formed between said file access processing section and said second connector, the voltage converter section reducing a voltage outputted from said power supply unit to apply the reduced voltage to said file access processing section.

13. A circuit board for the storage device controlling apparatus according to claim 8, wherein electric power is supplied from said power supply unit to said second connector via an electric power cable.

14. A circuit board for the storage device controlling apparatus according to claim 9, further comprising a communication connector located on said chassis, wherein said file access processing section and said information processing apparatus are connected through said communication connector.

* * * * *

Disclaimer

7,380,057 — Shuji Sugimoto, Kanagawa (JP). STORAGE DEVICE CONTROLLING APPARATUS AND A CIRCUIT BOARD FOR THE SAME. Patent dated May 27, 2008. Disclaimer filed August 26, 2008, by the assignee, Hitachi, Ltd.

The term of this patent should not extend beyond the expiration date of Patent No. 7,136,962.
*(Official Gazette November 25, 2008)*